United States Patent [19]

Umina et al.

[11] Patent Number: 5,287,485

[45] Date of Patent: Feb. 15, 1994

[54] DIGITAL PROCESSING SYSTEM INCLUDING PLURAL MEMORY DEVICES AND DATA TRANSFER CIRCUITRY

[75] Inventors: Leonard J. Umina, Marlboro; Robert A. Anselmo, Stow, both of Mass.

[73] Assignee: Digital Equipment Corporation, Maynard, Mass.

[21] Appl. No.: 41,129

[22] Filed: Mar. 31, 1993

Related U.S. Application Data

[60] Continuation of Ser. No. 696,741, May 7, 1991, abandoned, which is a division of Ser. No. 288,168, Dec. 24, 1988, Pat. No. 5,031,146.

[51] Int. Cl.⁵ .................... G06F 13/00; G11C 11/413
[52] U.S. Cl. ................. 395/425; 365/230.03; 365/154; 364/DIG. 2; 364/964.6
[58] Field of Search ...................... 395/425; 364/200 MS File, 900 MS File; 365/230.03, 154, 156

[56] References Cited

U.S. PATENT DOCUMENTS

| | | | |
|---|---|---|---|
| 3,763,480 | 10/1973 | Weimer | 365/238 |
| 3,772,658 | 11/1973 | Sarlo | 365/238 |
| 4,125,877 | 11/1978 | Reinert | 365/190 |
| 4,209,850 | 6/1980 | Tazaki | 365/230.03 |
| 4,229,789 | 10/1980 | Morgan et al. | 395/425 |
| 4,434,502 | 2/1984 | Arakawa et al. | 382/41 |
| 4,435,787 | 3/1984 | Yasuoka | 365/174 |
| 4,449,199 | 5/1984 | Daigle | 395/425 |
| 4,468,727 | 8/1984 | Carrison et al. | 395/800 |
| 4,575,819 | 3/1986 | Amin | 365/104 |
| 4,616,347 | 10/1986 | Bernstein | 365/230.05 |
| 4,672,580 | 6/1987 | Yau et al. | 365/149 |
| 4,685,085 | 8/1987 | Spence | 365/190 |
| 4,713,756 | 12/1987 | Mackiewicz et al. | 365/228 |
| 4,809,225 | 2/1989 | Dimmler et al. | 365/145 |
| 4,825,409 | 4/1989 | Bessolo et al. | 365/154 |
| 4,835,684 | 5/1989 | Kanai | 365/230.03 |
| 4,864,544 | 9/1989 | Spak et al. | 365/189.12 |
| 4,873,665 | 10/1989 | Jiang et al. | 365/154 |
| 4,942,575 | 7/1990 | Earnshaw et al. | 371/10.1 |

FOREIGN PATENT DOCUMENTS 62-291168  12/1987  Japan ................. 365/230.03

OTHER PUBLICATIONS

IBM TDB, "Simultaneous Access Memory", vol. 23, No. 2, Jul. 1980, pp. 657-658, C. A. Price.

IBM TDB, "Reflective Random-Access Memory", vol. 29, No. 3, Aug. 1986, pp. 1206-1208.

Primary Examiner—Glenn Gossage
Attorney, Agent, or Firm—Denis G. Maloney; Albert P. Cefalo

[57] ABSTRACT

A digital processing system includes first and second processors and first and second random access memories (RAMs) respectively associated with the first and second processors. Each of the first and second RAMs includes a plurality of independent memory cells, each cell in the first RAM having associated therewith a corresponding cell in the second RAM. Input/output circuitry provides independent access by the first processor to the first RAM and by the second processor to the second RAM. Control logic is responsive to a transfer control signal to simultaneously transfer data stored in the memory cells of one of the first and second RAMs into the corresponding cells of the other of the first and second RAMs. Data may be selectively transferred such that only data stored in selected memory cells is transferred between the first and second RAMs.

3 Claims, 7 Drawing Sheets

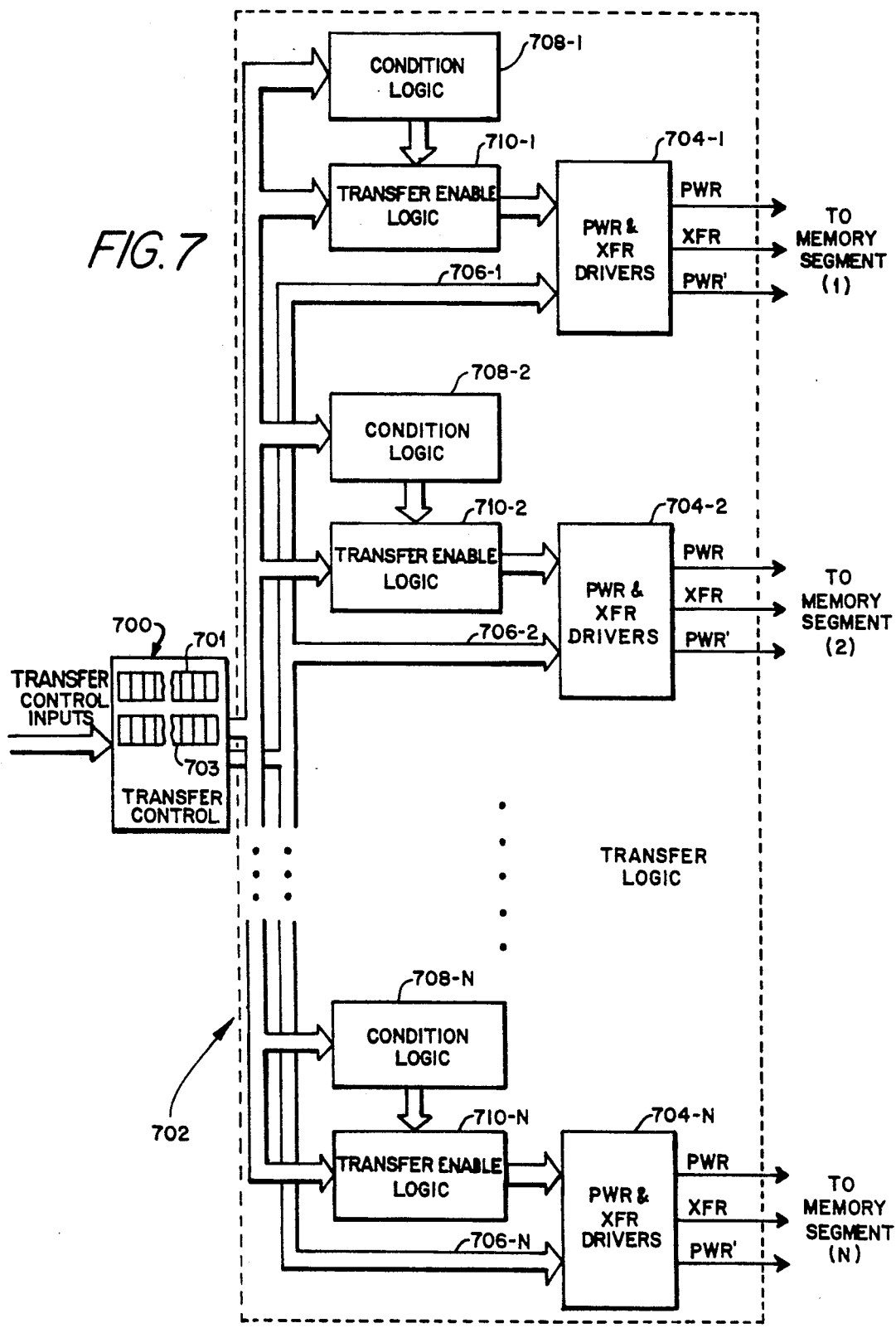

DIGITAL PROCESSING SYSTEM INCLUDING PLURAL MEMORY DEVICES AND DATA TRANSFER CIRCUITRY

This application is a continuation of application Ser. No. 07/696,741, filed May 7, 1991, now abandoned, which was a divisional of 07/288,168 filed Dec. 24, 1988, now U.S. Pat. No. 5,031,146.

The present invention is directed in general to allocating memory resources in a multiple processor system and, more specifically, to memory apparatus for enabling the rapid transfer of data between memories respectively associated with the processors in a multiple processor system.

BACKGROUND OF THE INVENTION

In multiple processor computing systems there exists the need to provide memory resources to each processor can perform tasks independent of the other processor(s). There further exists a need in such systems to provide a capability for the exchange of information between the respective processors. In some processing applications, e.g., image processing, the amount of data to be transferred from the memory of a sending processor to the memory of a receiving processor can be substantial. Many configurations of communication buses, memories and processors have been developed to meet these needs in the context of varying system requirements. However, the known configurations are subject to a variety of performance restrictions, e.g., limited bus accessibility, delay penalties associated with arbitration schemes, etc.

FIG. 1A illustrates an exemplary prior art dual processor system 100 comprising a first processor 102, an associated random access memory (RAM) 104, a second processor 106 and an associated RAM 108. System 100 also includes an address bus 110 and a data bus 112, the buses being coupled to data and address ports of the two processors and two RAMS. In operation, each processor gains access to the buses at different times under control of bus arbitration apparatus (not shown) in order to access its associated memory for data read or write operations. In order to transfer data between the processors, each processor has access to the memory associated with the other processor via buses 110 and 112. For example, processor 102 may gain control of the buses to read data from or write data to address locations in RAM 108.

One drawback to the configuration of system 100 is that one processor is always isolated from the bus while the other processor accesses either its associated memory or the memory associated with the other processor. Such isolation of one processor results in system operating inefficiency. Another drawback of the system 100 configuration is that each interprocessor data transfer is controlled by one of the processors and is therefore limited to the rate at which that processor can effect the transfer. As a result, a substantial amount of time would be required when a large amount of data is to be transferred from one memory into the other. A third drawback relates to the additional concerns in programming the operation of the processors to assure that in the course of data transfer operations, one processor does not mistakenly overwrite the valid data of the other processor.

A variant of the system 100 configuration is one in which RAMs 104 and 108 are actually contained in a single memory with respective memory portions dedicated to the processors and an additional common memory portion is allocated for sharing between the processors. With the memory so configured, the shared portion would be used for interprocessor data transfers. That is, data required by one processor may be written by the other processor into the common memory portion for subsequent reading by the processor requiring the data. While such a memory configuration may reduce the chance for data overwrite errors, since the common memory portion is uniquely allocated for data transfers, the configuration nevertheless generally suffers the same operating inefficiencies described above with respect to memory read/write operations in system 100.

One solution for reducing the amount of time required for data transfer in a system such as system 100 is to provide direct memory access (DMA) capability between the respective memories of the processors. In such a case, a DMA controller (not shown) would be coupled to the processors, their respective memories and to the buses in a manner known in the art. Then, in accordance with memory location identifying information provided by the processor initiating the data transfer, the control of the buses would be relinquished by both processors and the data transfer would be effected by the DMA controller. As is well known, such DMA transfer is accomplished at greater speed than a processor controlled data transfer. One drawback to the use of DMA to effect the data transfer is the system inefficiency resulting from isolating both processors from the bus during the transfer. An additional drawback derives from the hardware cost associated with providing the DMA capability.

Yet another solution to the above described problems associated with effecting interprocessor data transfers is the provision of a dual ported memory for enabling data transfer between two processors. FIG. 1B illustrates a system 150 which is the same as system 100 except for the introduction of a dual ported RAM 152 shared between processors 102 and 106 and the segmentation of buses 110 and 112 to create additional address and data buses 154 and 156. Due to provision of dual ported RAM 152, each processor has no need for access to the RAM associated with the other processor and therefore has exclusive access to its associated RAM, via the data and addresses buses, for performing its own tasks. As a result, separate bus segments, illustrated in FIG. 1B as coupling dual ported RAM 152 to processors 102 and 106, can be provided for the respective processors to avoid delays that would otherwise result from bus sharing.

As is well known in the art, each processor connected to the dual ported memory has access to the entire contents of that memory. However, since both processors access the same memory, the address and data buses in the dual ported RAM must be multiplexed and the delay introduced by this logic degrades memory access performance. Further, dual ported memory operates more slowly than conventional memory, and, as a result, offers no real increase in operating speed for operations requiring the reading or writing of large amounts of data.

SUMMARY OF THE INVENTION

Additional advantages of the invention will be set forth in part in the description which follows, and in part will be obvious from the description, or may be learned by practice of the invention. The advantages of the invention may be realized and attained by means of the instrumentalities and combinations particularly pointed out in the appended claims.

The present invention overcomes the problems and disadvantages of the prior art by providing memory apparatus including random access memories respectively associated with different processors, the memory apparatus being responsive to a transfer control signal to cause the simultaneous transfer of data held in memory cells of one memory into corresponding memory cells in a different one of the memories.

In accordance with the principles of the present invention, there is provided digital memory storage apparatus, responsive to external input/output (I/O) signals and a transfer control signal. The apparatus comprises a first and a second random access memory (RAM) means, each containing a plurality of independent memory cells, for retrievably storing digital data. The first RAM means includes first I/O means for providing access to the digital data stored in the first RAM means in response to the I/O signals. The second RAM means includes second I/O means for providing access to the digital data stored in the second RAM means in response to the I/O signals independently of the access to the digital data stored in the first RAM means by the first I/O means. The apparatus further comprises control means, responsive to the transfer control signal, for simultaneously copying the digital data in the memory cells of one of the RAM means into corresponding ones of the memory cells of the other RAM means.

The accompanying drawings, which are incorporated in and constitute a part of this specification, illustrate embodiments of the invention and, together with the description, serve to explain the principles of the invention.

BRIEF DESCRIPTION OF THE DRAWINGS

FIG. 7 illustrates a transfer logic configuration for enabling conditional transfers between memory segments of two memories;

DETAILED DESCRIPTION OF THE PREFERRED EMBODIMENT

Figure 1:
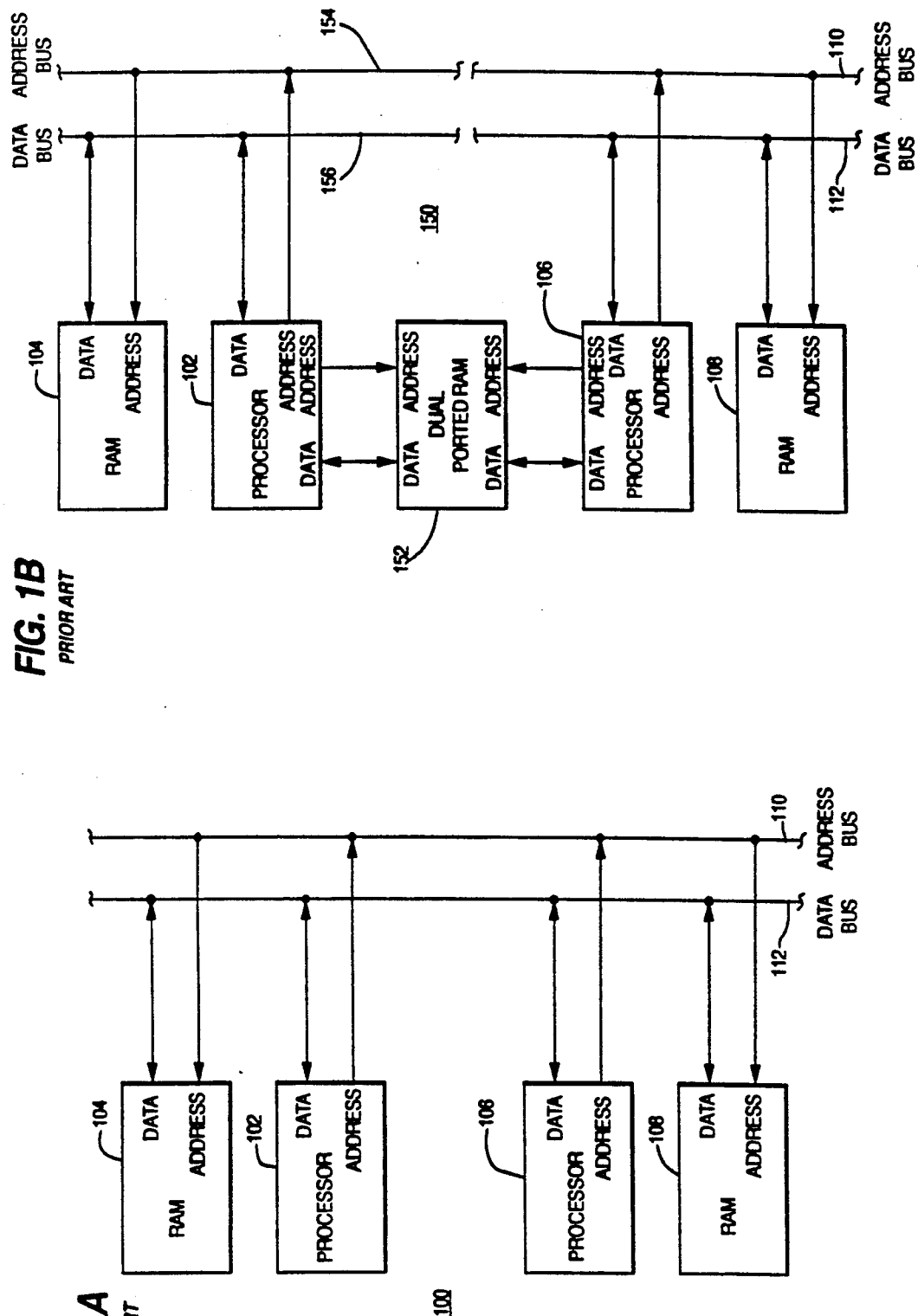
FIGS. 1A and 1B illustrate prior art dual processor systems.

Reference will now be made in detail to the present preferred embodiment of the invention, an example of which is illustrated in the accompanying drawings. Whenever possible, the same reference numbers will be used throughout the drawings to refer to the same or like parts.

In accordance with the digital processing system of the present invention, first processing means are provided for processing digital data in accordance with programmed instructions, and second processing means are provided for processing digital data in accordance with programmed instructions. Each processor 202,206 may be an Intel 80386 processor. In a dual processor system 200 shown in FIG. 2, processors 202 and 206 can operate as first and second processor means, respectively.

Also in accordance with the present invention, first and second RAM means are provided for retrievably storing digital data. In dual processor system 200, a static random access memory (SRAM) 204 associated with processor 202 and an SRAM 208 associated with processor 206 can operate as first and second RAM means, respectively.

Memory 204 has coupled thereto an address decoder 210 which receives addresses for application to memory 204 from an address multiplexer 212. Similarly, an address decoder 214 is coupled to memory 208 and receives addresses from an address multiplexer 216. An address port of processor 202 is coupled to apply generated addresses to an address bus 218 which is in turn coupled to apply an address to both address multiplexers 212 and 216. Similarly, an address port of processor 206 is coupled to apply an address to an address bus 220 which is connected to both address multiplexers. Each processor 202,206 includes conventional address generating hardware, not shown, for generating memory addresses.

Figure 2:
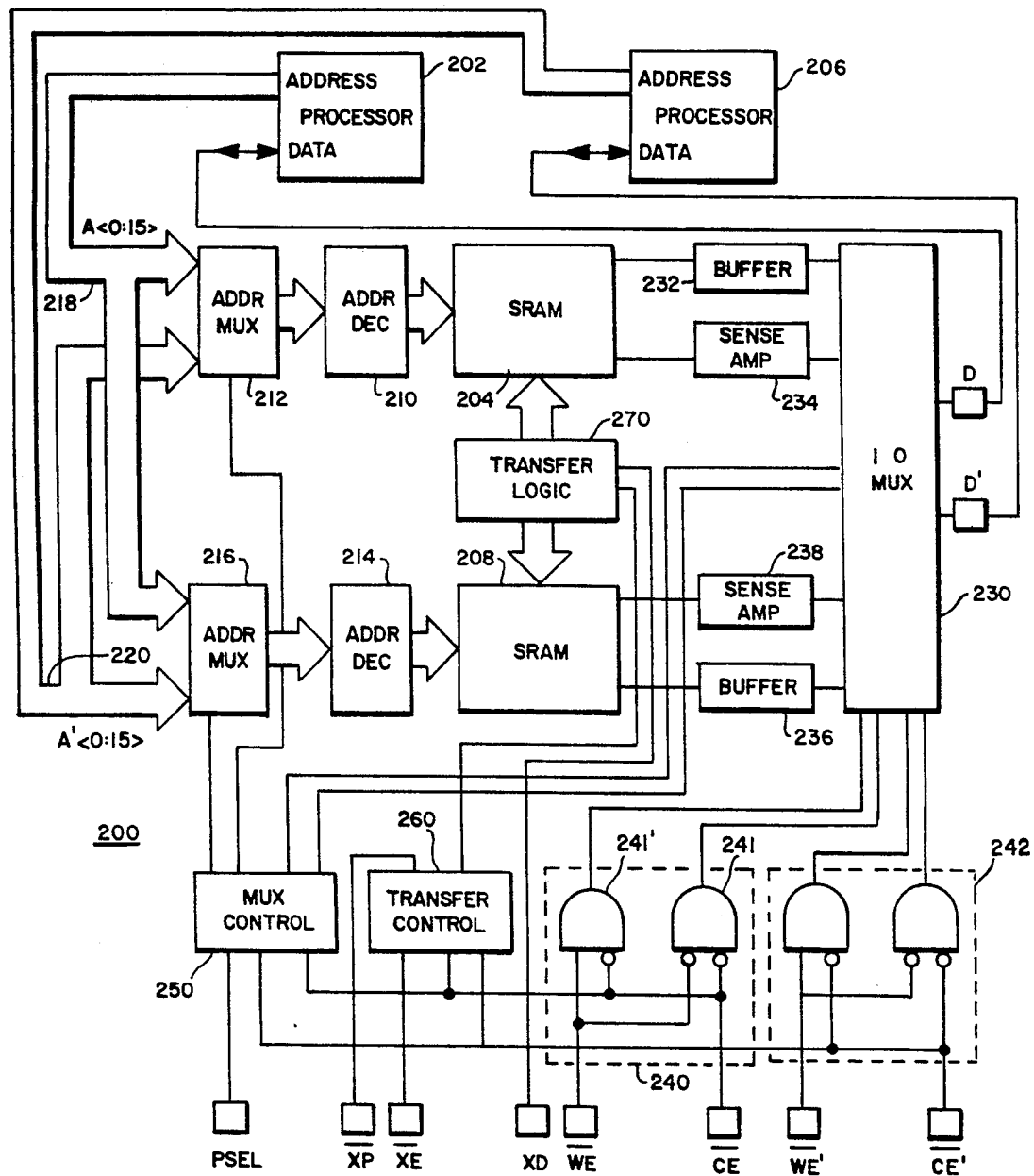
FIG. 2 illustrates a dual processor system including memory apparatus constructed in accordance with the present invention.

In the embodiment of the present invention illustrated in FIG. 2, both memories 204 and 208 are provided as 64K × 1 static memory arrays. As a result, address buses 218 and 220 are each 16 bits wide for respectively carrying addresses A and A' generated by processors 202 and 206, respectively. The successful practice of the present invention, however, is in no way a function of the particular memory dimensions, and the 64K × 1 SRAMs are selected only for the purpose of explanation.

The memory apparatus of the present invention further includes input/output (I/O) means for providing independent access to the digital data stored in the first and second RAM means. As embodied herein, the I/O means can include a buffer 232 and a sense amplifier 234 coupled to memory 204 for data read and write operations with that memory, and a buffer 236 and a sense amplifier 238 coupled to memory 208 for the same purpose. An I/O multiplexer 230 is coupled to buffers 232 and 236 and to sense amplifiers 234 and 238 to enable data I/O with the two memories.

Data being read or written in memory 204 appears on a data pin D which is provided as an output of multiplexer 230 and coupled to a data port of processor 202. Similarly, a data pin D' is provided as an output of multiplexer 230 on which data being read or written in memory 208 appears, pin D' being coupled to a data port of processor 206. The connection between processor 202, associated pin D and address bus 218 is isolated from the connection between processor 206, pin D' and address bus 220.

Each processor 202,206 controls access to its associated memory by applying (via interconnections not shown in FIG. 2) appropriate control signals to write enable and chip enable pins of the memory apparatus.

Thus, control signals applied to pins $\overline{WE}$ (write enable) and $\overline{CE}$ (chip enable) control read and write operations for memory 204, while control signals applied to pins WE' and CE' control read and write operations for memory 208. In accordance with standard notation, the bars over the CE, WE, CE' and WE' pin designations in FIG. 2 indicate that those pins are asserted when the signal applied thereto is at a low logic level. For example, when pin $\overline{CE}$ is asserted by application of a low logic level signal, data may be written into memory 204 by asserting pin $\overline{WE}$ (by a low logic level signal), and the data applied to pin D will be written to the bit position specified by address A applied to address bus 218. With respect to reading, when pin $\overline{CE}$ is asserted and the $\overline{WE}$ pin is not asserted, the data specified by address A of memory 204 is driven onto pin D. Application of control signals to pins WE' and CE' in the same manner causes read and write operations on memory 208.

As seen in FIG. 2, the pair of pins $\overline{CE}$ and $\overline{WE}$ are connected to AND logic block 240, while the pin pair CE' and WE' are connected to AND logic block 242. Both logic blocks 240 and 242 operate in the same manner so only one block's operation will be described. With respect to block 240, upon asserting pin $\overline{CE}$, a logic "1" is applied to one input of both AND gates within the block. Then, depending on whether the signal applied to the $\overline{WE}$ pin is low (write) or high (read), a logic "1" signal is produced by AND gate 241 or 241', respectively, within the block. Thus, one or the other of the lines connecting block 240 to the I/O multiplexer is raised to the logic "1" level according to whether a read or write operation is being performed. The read or write signal so generated by block 240 is transmitted via the I/O multiplexer, buffer 232 and sense amplifier 234 to memory 204 to control its operation in a well-known manner. In view of the above-described isolation between the data and address connections of the two processors, each processor can perform read or write operations on its associated memory independently and asynchronously from the other processor.

The memory apparatus of system 200 includes the capability to switch memories 204 and 208 between the address, data and memory control inputs. This capability is made possible, in part, by a multiplexer controller 250 which, as seen in FIG. 2, is connected to receive the signals applied to pins $\overline{CE}$ and CE' as well as to a memory select pin PSEL. Multiplexer controller 250 operates in response to the logic level of the signal applied to pin PSEL to control operation of address multiplexers 212 and 216 and I/O multiplexer 230. When the signal applied to the PSEL pin is high, address A and pins $\overline{CE}$, $\overline{WE}$ and D operate on memory 204, while address A' and pins CE', WE' and D' operate on memory 208. Upon applying a low logic level signal to pin PSEL, the functions of the primed and unprimed pins are switched. That is, address A and pins $\overline{CE}$, $\overline{WE}$ and D operate on memory 208, while address A' and pins CE', WE' and D' operate on memory 204. While the memory switching capability is included as an advantageous feature of system 200, it does not provide the rapid transfer of data between memories that is the subject matter of the present invention.

In accordance with the present invention, the memory apparatus of system 200 is additionally controllable to effect a data transfer directly between selected memory cells in memories 204 and 208. That is, selected individual memory cells of static memory 204 are uniquely associated with corresponding memory cells in static memory 208 and the memory apparatus is controllable to cause the data stored in the selected cells of one memory to be simultaneously written into their corresponding cells in the other memory. For ease of understanding, but without limitation on the scope thereof, the invention will first be described in the context of both memories 204 and 208 being of identical size and every memory cell in one memory having a corresponding memory cell in the other memory.

The simultaneous transfer of data, referred to hereinafter as a flash transfer, is controlled by external transfer control signals applied to a transfer enable pin $\overline{XE}$ and a transfer direction pin XD. As indicated in FIG. 2, a low logic level signal is applied to pin $\overline{XE}$ to enable the transfer. By applying a high or low logic level signal to pin XD, data will be transferred from memory 204 to 208 or from memory 208 to 204, respectively. The memory apparatus of the present invention includes transfer control means, responsive to the external transfer control signals, for causing the data flash transfer. As embodied herein, the transfer control means includes a transfer control block 260 and a transfer logic block 270. Pin $\overline{XE}$ is coupled to the transfer control block 270 which is also coupled to receive the chip enable signals applied to pins $\overline{CE}$ and CE'. A transfer can only occur when both pins $\overline{CE}$ and CE' are not asserted. That is, the transfer is initiated on the condition embodied in the Boolean expression:

$$XE\_L \text{ and NOT } (CE\_L) \text{ and NOT } (CE'\_L), \quad (1)$$

where the "_L" notation indicates that the associated signal is asserted when at the low logic level. Logic is therefore included in the transfer control block to implement the logic embodied in Boolean expression (1) in decoding the signals applied to the $\overline{XE}$, $\overline{CE}$ and CE' pins. If the logic for initiating a flash transfer is satisfied, transfer control block 260 generates a series of signals for initiating and controlling the flash transfer. The transfer control signals generated by block 260 as well as the signal applied to pin XD are applied to transfer logic block 270 which controls the corresponding memory cells in both memories to carry out the data transfer. The functions performed by block 270 are described in greater detail below. Transfer control block 260 also generates an output signal on a pin $\overline{XP}$. The $\overline{XP}$ pin is driven low by the transfer control block during the transfer operation. The signal on the $\overline{XP}$ pin may therefore be advantageously used to inhibit separate accesses to memories 204 and 208 by processors 202 and 206 while the flash transfer is occurring.

In accordance with the present invention, simultaneous transfer of data between memory cells of the respective memories as illustrated in FIG. 2 is accomplished by fabricating the two memories on a common integrated circuit chip substrate with the corresponding cells of the two memories positioned adjacent one another. In this manner, the respective memory cells of the two memories are physically integrated with one another on the same chip.

Figure 3:
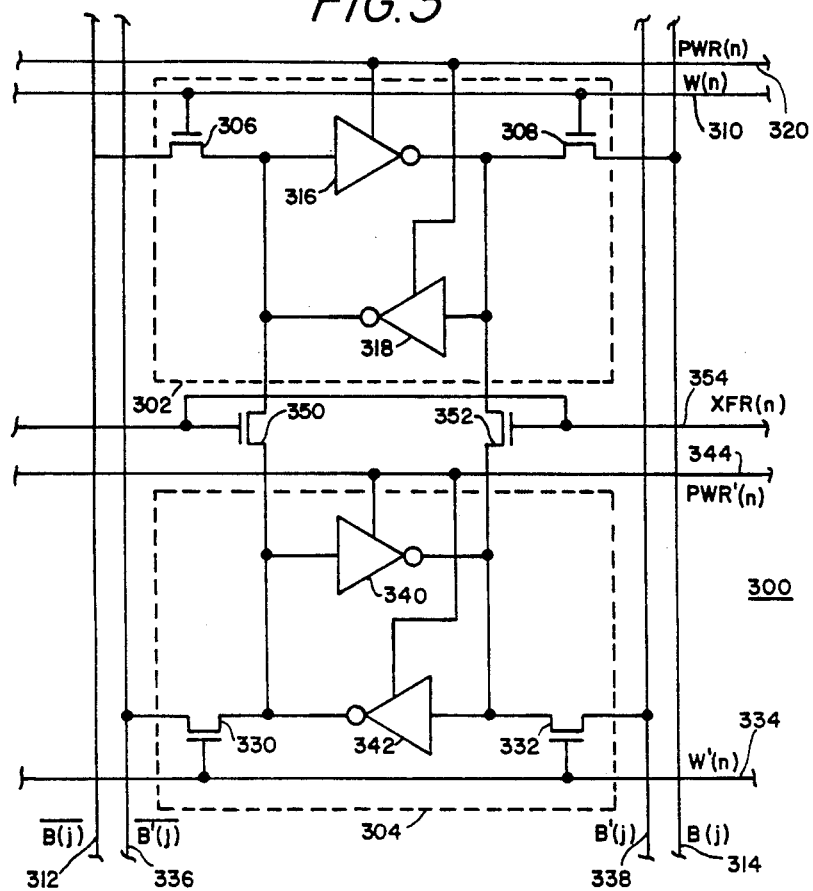
FIG. 3 illustrates a memory storage cell constructed in accordance with the present invention.

FIG. 3 illustrates an exemplary storage cell contained on the chip on which memories 204 and 208 are integrated. Storage cell 300 comprises a memory cell 302 of memory 204 and a memory cell 304 of memory 208. Each memory cell 302, 304 is preferably configured as a conventional six transistor memory cell. Cell 302 comprises MOS transistors 306 and 308, the respective gate terminals of these transistors being connected to a word line 310 to which a word signal W(n) can be applied. The signal W(n) is preferably one of "m" signals ($1 \leq n \leq m$) applied to one of "m" word lines of memory 204. A source terminal of transistor 306 is connected to a bit line 312 to which a signal B(j) can be applied. Similarly, a source terminal of transistor 308 is connected to a bit line 314 to which a signal B(j) can be applied. The signals B(j) and B(j) are preferably one of "i" signal pairs ($1 \leq j \leq i$) applied to one of "i" bit line pairs of memory 204. Memory cell 302 also includes inverter circuits 316 and 318 cross-coupled to form a flip-flop circuit. Each inverter circuit is of a conventional type comprising two transistors (not shown). The two inverter circuits are connected to a controllable power supply voltage source via a power supply line 320. The supply voltage applied to the inverter circuits in cell 302 is designated PWR(n) and is controllable to facilitate a flash transfer in a manner more fully described below.

Memory cell 304 is constructed substantially identically to cell 302 and comprises transistors 330 and 332 having gate terminals connected to a word line 334 to which a word signal W'(n) can be applied. The respective source terminals of transistors 330 and 332 are connected to bit lines 336 and 338 to which signals B'(j) and B'(j) can be applied. Like memory 204, memory 208 includes "m" word lines and "i" pairs of bit lines. Memory cell 304 further includes inverter circuits 340 and 342 cross-coupled to form a flip-flop in the same manner as described above for cell 302. Both inverter circuits 340,342 are connected to a power supply line 344 to which a controllable power supply voltage PWR'(n) is applied.

The above noted transfer control means of the present invention, as embodied herein, further comprises two MOS transfer transistors 350 and 352 in storage cell 300 that are coupled between input/output terminals of the respective flip-flop circuits of memory cells 302 and 304. The respective gates of transfer transistors 350 and 352 are connected to a transfer control line 354 to which a transfer control signal XFR(n) can be applied.

As can be seen in FIG. 3, each bias and word line is illustrated as continuous for connection to adjacent storage cells in the integrated memory structure forming memories 204 and 208, it being understood that other bit and word lines, not shown, are also provided for access to other memory cells in the memory structure. In accordance with conventional memory cell read and write operations, cell 302 would be selected for a read or write operation by asserting a high logic level signal W(n) to word line 310 to render transistors 306 and 308 conductive. With a signal so asserted on the word line, data can be written into cell 302 by driving the appropriate signals B(j) and B(j) onto lines 312 and 314, respectively. For example, to write "0" into cell 302, applying B(j) low and B(j) high results in setting the flip-flop formed by inverter circuits 316 and 318 to store a "0" logic state. Application of logic levels B(j) high and B(j) low, results in writing a "1" into the cell. Both lines 312 and 314 are connected to sense amplifier 234 for reading the data stored in cell 302 while the W(n) signal is asserted. This operation is well-known in the art.

Conventional memory read and write operations on cell 304 would be performed in analogous fashion by appropriate application of word signal W'(n) and signals B'(j) and B'(j). During such conventional read and write operations on memory cells 302 and 304, transfer control signal XFR(n) is deasserted so that transfer transistors 350 and 352 are turned off and, therefore, in a high impedance state.

As noted above, storage cell 300 is exemplary of the cells forming memories 204 and 208 of system 200 (FIG. 2). As can be seen from the configuration of storage cell 300, the two memories 204 and 208 are integrated physically with one another on the integrated circuit chip on which they are fabricated. It is this physical integration that enables the simultaneous transfer of the data stored in the respective memory cells of one static memory into the cells of the other memory.

A sequence of operations on the respective storage cells 300 comprising memories 204 and 208 is required to effect the flash transfer of data between the memories. The logic for controlling this sequence of operations is embodied in transfer control block 260 and transfer logic block 270 shown in FIG. 2 and described in greater detail below.

In order to perform the flash transfer of data stored in the respective memory cells of memory 302 into the cells of memory 304, the following sequence of operations is performed. This sequence is described with respect to exemplary storage cell 300, it being understood that for a flash transfer of the entire memory the same operations are simultaneously performed on the balance of storage cells comprising the two memories.

Assuming that the logic of Boolean expression (1) has been satisfied, the first step in effecting the flash transfer of data is to reduce the power to the memory cells of the memory receiving the data being transferred. In this example, this requires reducing the level of supply voltage PWR'(n) to inverter circuits 340 and 342. The supply voltage is reduced to a level at which the output impedance of each of the cross-coupled inverter circuits is large compared to the "on" resistance of transfer transistors 350 and 352 (which at this stage of the flash transfer operation have not yet been turned "on"). It is noted that where memories 204 and 208 are fabricated with CMOS static cells or NMOS cells with resistive pull-ups, the supply voltage reduction may be effected by either reducing the positive supply voltage to a level near the negative supply or raising the negative supply. With respect to the illustrated embodiment herein, the supply voltage reduction is assumed to be accomplished by reducing the positive voltage supply.

Figure 4:
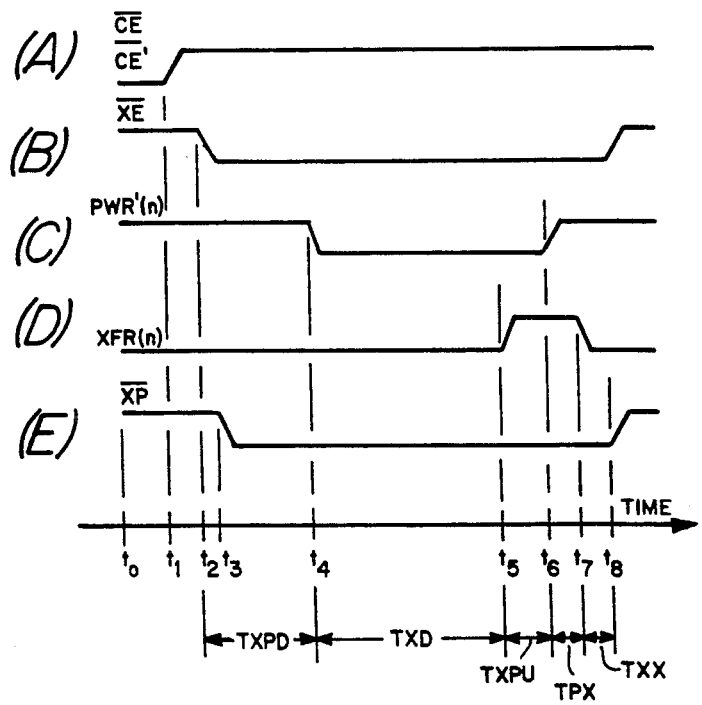
FIG. 4 illustrates a timing diagram descriptive of a memory data transfer operation in accordance with the present invention.

FIG. 4 illustrates a transfer timing diagram showing the respective levels and interrelationships of the various signals generated during the flash transfer. The timing diagram includes a time axis at the bottom of FIG. 4 relative to which the timing of the various signals A through E are drawn. As can be seen, diagram A shows the deassertion of both chip enable signals $\overline{CE}$ and CE' at a time $t_1$. Diagram B shows the assertion of the transfer enable signal $\overline{XE}$ at a time $t_2$ after both $\overline{CE}$ and CE' have been deasserted. As previously described with reference to Boolean expression (1), the transfer is initiated when both CE_L and CE'_L are deasserted and XE_L is asserted. Diagram E of FIG. 4 illustrates assertion of the above described access inhibiting signal $\overline{XP}$ a time $t_3$ immediately following assertion of $\overline{XE}$.

The power supply voltage PWR'(n) (diagram C in FIG. 4) is reduced at a time $t_4$ in accordance with the above described first step in effecting the flash transfer. The time $t_4$ is delayed by a time delay TXPD measured from assertion of $\overline{XE}$ at time $t_2$. The length of time delay TXPD is determined by a time delay circuit contained in transfer control block 260.

As a second step, the transfer control signal XFR(n) is applied to line 354 to render transistors 350 and 352 conductive. As a result of these transistors becoming conductive, the state of the flip-flop in cell 302 is applied to the inverter circuits forming the flip-flop in cell 304. Assertion of the XFR(n) signal is illustrated in FIG. 4 (signal D) as occurring at a time $t_5$ after a time delay TXD measured from the PWR'(n) signal reduction at time $t_4$. The duration of time delay TXD is controlled by the time delay circuit included in transfer control block 260 (FIG. 2). The actual time allocated for delay TXD would in practice be determined from considerations including the maximum slew rate allowable for the power supply to the memory cell into which data is being written during the flash transfer. That is, depending upon the specific nature of the memory cell design, it may be desirable to limit the rate at which the voltage is reduced in order to assure that the bit value stored in the "sending" memory cell is not disturbed.

There are also considerations in designing the storage cells as embodied in integrated circuitry to assure that when the transfer transistors are rendered conductive, the "sending" memory cell bit value is not disturbed. Thus, the geometry of the transfer transistors and/or the signal level on the transfer control line should be selected to avoid such disturbance of the stored bit value.

Referring to FIG. 3, the third step of the transfer requires restoring power to the receiving cell flip-flop inverter circuits while transistors 350 and 352 are still conductive. This will cause the flip-flop in cell 304 to store the same data value as is stored by the flip-flop in cell 302. For example, assuming that cell 302 stores a "1," then a low logic voltage exists at the node between transistor 306 and inverter circuit 316 and a high logic voltage exists at the node on the output of inverter circuit 316. These logic voltages are applied to the flip-flop in cell 304 via transistors 350 and 352 in the conducting state with the result that a differential voltage is applied across the flip-flop formed by inverter circuits 340 and 342. In essence, a low logic voltage is applied at the node between transistor 330 and inverter circuit 342 and, therefore, to the inverter circuit 340 input and inverter circuit 342 output. Further, a high logic voltage is applied to the input of inverter circuit 342 and output of inverter circuit 340. With this differential voltage so applied, when power is restored to the flip-flop in cell 304, inverter circuits 340 and 342 will further drive their respective outputs to assume the high and low logic states applied thereto via transistors 350 and 352.

For example, a low logic voltage applied to the input of inverter circuit 340 will cause that circuit to drive its output higher. Similarly, a high logic voltage level applied to the input of inverter circuit 342 will cause that inverter circuit to drive its output low. Thus, the operation of inverter circuits 340 and 342 will establish a logic state identical to that assumed by the flip-flop in memory cell 302.

The timing for the third flash transfer step is illustrated in the timing diagram of FIG. 4. As seen, restoration of the PWR'(n) signal (diagram C) occurs at a time $t_6$ following a delay period TXPU measured from time $t_5$. The duration of time delay TXPU is controlled by the time delay circuit contained in transfer control block 260.

A final step in the flash transfer operation is deasserting the XFR(n) signal such that transistors 350 and 352 become non-conductive. With the final step complete, memory cell 304 stores the same data as memory cell 302. Deassertion of XFR(n) (diagram D) is illustrated in FIG. 4 as occurring at a time $t_7$ following a time delay TPX measured from $t_6$. The duration of TPX is determined by the time delay circuit contained in transfer control block 260 (FIG. 2). As also seen in the timing diagram, the memory access inhibiting signal $\overline{XP}$ is deasserted at a time $t_8$ following a time delay TXX measured from time $t_7$. The duration of delay TXX is determined by the time delay circuit contained in transfer control block 260.

With the above-described sequence of operations simultaneously performed in all storage cells containing the respective memory cells of memories 204 and 208 (FIG. 2), the data stored in all memory cells in memory 204 is simultaneously transferred into the corresponding memory cells of memory 208. A similar operation can be used to transfer data from memory 208 to memory 204.

Figure 5:
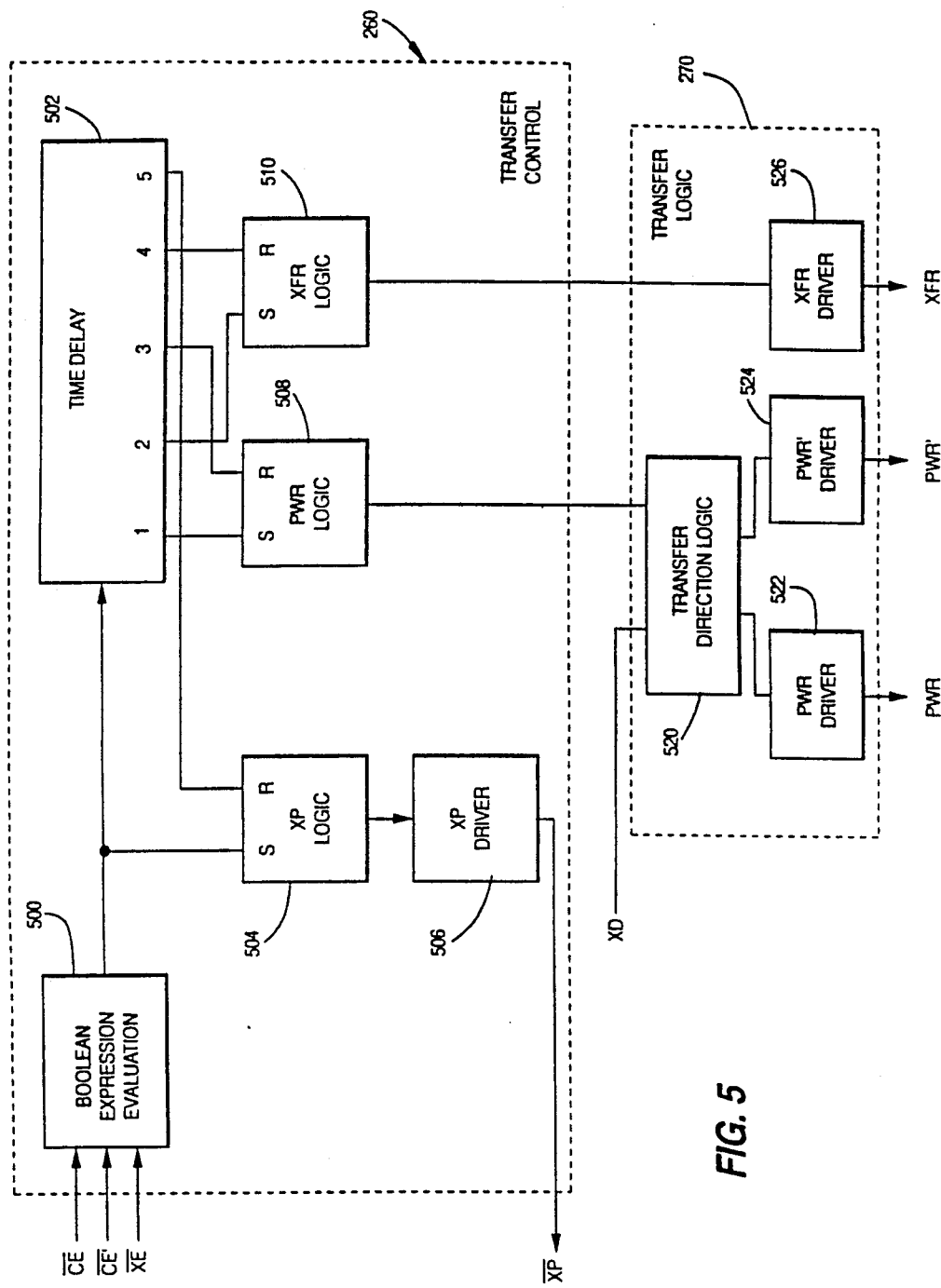
FIG. 5 illustrates in greater detail a transfer control block and a transfer logic block shown in FIG. 2.

FIG. 5 illustrates a preferred embodiment of transfer control block 260 and transfer logic block 270 of FIG. 2. With respect to block 260, the $\overline{CE}$, CE' and $\overline{XE}$ signals are applied to a Boolean expression evaluation block 500 that contains logic for evaluating Boolean expression (1). The output of block 500 is coupled to a time delay circuit block 502 and a set (S) input of a signal XP logic block 504. Block 500 provides a transfer initiation signal when the conditions of Boolean expression (1) are satisfied. The XP logic block includes a reset (R) input coupled to an output #5 of time delay circuit 502 and further includes an output coupled to an input of an XP driver circuit 506. An output of the latter circuit is connected to the above-described XP pin.

Time delay circuit 502 includes outputs #1 through #5 and is responsive to receipt of the transfer initiation signal to generate a predetermined sequence of timing control signals on its respective outputs. That is, a predetermined time delay ensues before the generation of each timing signal on each output #1 through #5 following application of the transfer initiation signal. These predetermined time delays are the delays described hereinabove and illustrated in the timing diagram of FIG. 4. Specifically, following receipt by time delay circuit 502 of the transfer initiation signal, a timing control signal is generated on output #1 after the time delay TXPD. The signal on output #2 follows the output #1 signal by the time delay TXD. The signal on output #3 follows the output #2 signal by the time delay TXPU. The signal on output #4 follows the output #3 signal by the time delay TPX. Last, the signal on output #5 follows the output #4 signal by the time delay TXX.

Output #1 of time delay circuit 502 is coupled to a set (S) input of a PWR logic block 508, a reset (R) input of that block being coupled to output #3 of circuit 502. Output #2 of the time delay circuit is coupled to a set (S) input of an XFR logic block 510, a reset (R) input of block 510 being coupled to delay circuit output #4.

Transfer logic block 270 includes a transfer direction logic block 520 coupled to receive the signal applied to pin XD and the output of PWR logic block 508. Block 520 operates as a demultiplexer such that in accordance with the state of the signal applied to pin XD, the output signal from PWR logic block 508 is applied to either a PWR driver circuit 522 or a PWR' driver circuit 524.

The respective power supply outputs PWR and PWR' of driver circuits 522 and 524 are applied by supply lines, not shown, to the memory cells associated with memories 204 and 208, respectively. Transfer logic block 270 further includes an XFR driver circuit 526 having an input connected to the output of XFR logic block 510. The transfer signal XFR output from driver circuit 526 is applied via control lines, not shown, to the storage cells for the purpose previously described.

The operation of blocks 260 and 270 is described next. During operation of system 200 when no flash transfer operation is being conducted, no transfer initiation signal is generated by evaluation block 500. As a result, both power supply outputs PWR and PWR' are provided to the respective memory cells of memories 204 and 208. Upon application of signals to evaluation block 500 satisfying the conditions required to initiate a flash transfer, that block generates the transfer initiation signal which is applied to XP logic block 504 and time delay circuit 508. Block 504 responsively provides an output which causes XP driver circuit 506 to generate the appropriate XP signal on the XP pin.

The time delay circuit, in response to the transfer initiation signal, begins generating the sequence of time delay signals. When the signal generated on output #1, after time delay TXPD, is applied to PWR logic block 508, that block responsively generates a signal that is applied to transfer direction logic block 520. Block 520 which also has applied thereto the transfer direction signal applied to pin XD, applies the block 508 signal to the one of drivers 522 or 524 associated with the receiving memory in the flash transfer. Application of the signal to the driver circuit causes the circuit to inhibit its output, the result being a reduction in the power supply voltage to the associated memory.

Generation of the timing signal on output #2 of circuit 502 after time delay TXD causes XFR logic block 510 to generate a signal applied to XFR driver 526 which responsively generates the transfer control signal XFR. As described above, the XFR signal renders conductive the transfer transistors in each storage cell of the memories.

Generation of the output #3 signal from circuit 502 after time delay TXPU cause PWR logic block 508 to reset causing the driver circuit 522 or 524 to return to an uninhibited state from an inhibited state. As a result, the power supply voltage is restored to the receiving memory cells.

Generation of the timing signal on output #4 of circuit 502 after time delay TPX resets the XFR logic block causing the XFR driver circuit 526 to cease generation of the XFR signal. As a result, the transfer transistors in the storage cells become nonconductive.

Upon generation of the timing signal on output #5 of circuit 502 after time delay TXX the XP logic block is reset and the XP driver no longer produces the XP signal for inhibiting normal access to the memories. The XE signal, which is externally generated, is assumed deasserted upon completion of the transfer.

Figure 6:
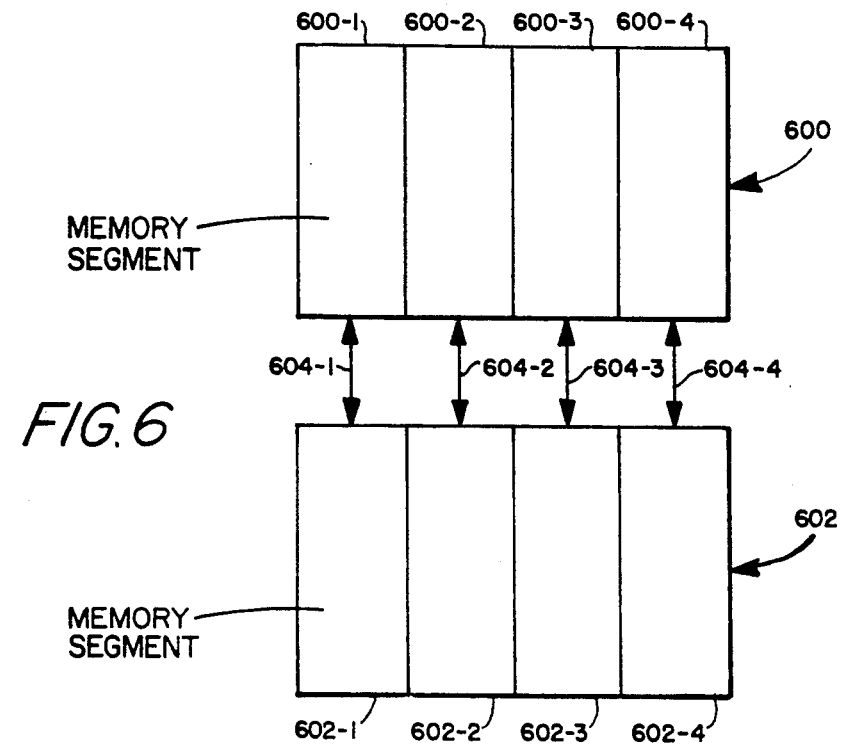
FIG. 6 illustrates further memory transfer capabilities between two segmented memories in accordance with the present invention.

While the present invention has been described hereinabove with respect to a flash transfer of all data stored in all memory cells of a sending memory into the corresponding cells of a receiving memory, the invention is not so limited. The invention may be practiced in the more general situation where only selected memory cells of the sending memory are flash transferred to corresponding selected cells of the receiving memory. In accordance with the present invention, this is preferably accomplished by segmenting the sending and receiving memories to enable control of flash transfers between corresponding memory segments. This aspect of the present invention is diagramatically illustrated in FIG. 6 wherein flash transfer operations can be controllably conducted between two static memories 600 and 602.

Memory 600 comprises memory segments 600-1, 600-2, 600-3 and 600-4, while memory 602 comprises segments 602-1, 602-2, 602-3 and 602-4 that correspond respectively to memory segments 600-1, 600-2, 600-3 and 600-4. Bidirectional arrow 604-1 illustrates that a flash transfer between the corresponding memory cells of memory segment pair 600-1 and 602-1 can be carried out in either direction, i.e. from memory segment 600-1 to memory segment 602-1 or from memory segment 602-1 to memory segment 600-1. Similarly, bidirectional arrows 604-2, 604-3 and 604-4 each indicate the ability to effect a flash transfer in either direction between the memory segments coupled thereto.

Preferably, the flash transfer in either direction between corresponding memory segments can be carried out independently of flash transfers between the other segments. For example, a flash transfer can be carried out between one or more pairs of corresponding memory segments while no transfer is carried out between any of the remaining memory segments. Further, where flash transfer is carried out between more than one pair of corresponding memory segments, the flash transfers occur simultaneously and need not occur in the same direction. The nature of the flash transfer between memories 600 and 602 can, therefore, be made subject to a selective transfer signal embodying user specified conditions that determine the memory segments and transfer directions to be carried out in the transfer.

Thus, as a further feature of the present invention, the memory apparatus can include means responsive to a selective transfer signal for copying only the data stored in selected memory cells of one RAM into the corresponding selected cells of another RAM. As embodied herein, such means preferably comprises the configuration of transfer logic illustrated in FIG. 7 for a processing system implementing memory segmented flash transfers as described above. That logic includes a transfer control logic block 700 which performs functions analogous to block 260 of system 200 (FIGS. 2, 5). Block 700 receives external transfer control input signals not only for initiating the transfer but also for identifying which memory segments are to be transferred. The block generates the time delay circuit controlled signals for controlling operation of the PWR, PWR' and XFR driver circuits in the same manner as described above with respect to block 260. Block 700 also provides selective transfer signals identifying the transfer conditions, i.e., which memory segments are to effect a flash transfer.

As an example of this operation, block 700 can comprise an enable register 701 and a direction register 703, the respective bit positions in each register corresponding to different memory segments. Then, the values loaded by the external transfer signals into the enable register would determine which memory segments participate in the flash transfer, while the direction register values determine the transfer direction for participating memory segments.

A transfer logic block 702 comprises a set of PWR, PWR' and XFR driver circuits 704-1, 704-2, . . . 704-N respectively associated with N memory segments into which the memories subject to flash transfer control are divided. Each driver circuit 704-1, 704-2, ..., 704-N receives via an input 706-1, 706-2, ..., 706-N the control signals generated by the time delay circuit and logic in transfer control block 700 for controlling the PWR, PWR' and XFR driver circuits.

The transfer logic block further includes condition logic blocks 708-1 through 708-N and transfer enable logic blocks 710-1 through 710-N respectively associated with the N memory segments. These blocks are coupled to receive the control signals identifying the segments participating in the transfer. The condition logic block includes logic for evaluating whether the memory segment associated therewith is included in the flash transfer, such logic providing an output signal in accordance with its determination. With respect to the above-described example utilizing an enable register, each block 708 would at least receive the bit value stored in the enable register position corresponding to the associated memory segment. The transfer enable block is coupled to receive the condition logic block output signal as well as the segment identifying control signal. Each transfer enable block is coupled to its associated driver circuits 704 and contains logic for generating, when the associated memory segment is not included in the flash transfer, a signal to inhibit the effect of the control signals received on input 706.

With respect to transfer direction control, a transfer direction bit, such as the one stored in the above-described exemplary direction register 703, would be applied (not shown in FIG. 7) directly to transfer direction logic (not shown) associated with each pair of PWR and PWR' driver circuits contained in each circuit 704, the function of the direction logic being the same as described above with respect to block 520 in FIG. 5.

Figure 8:
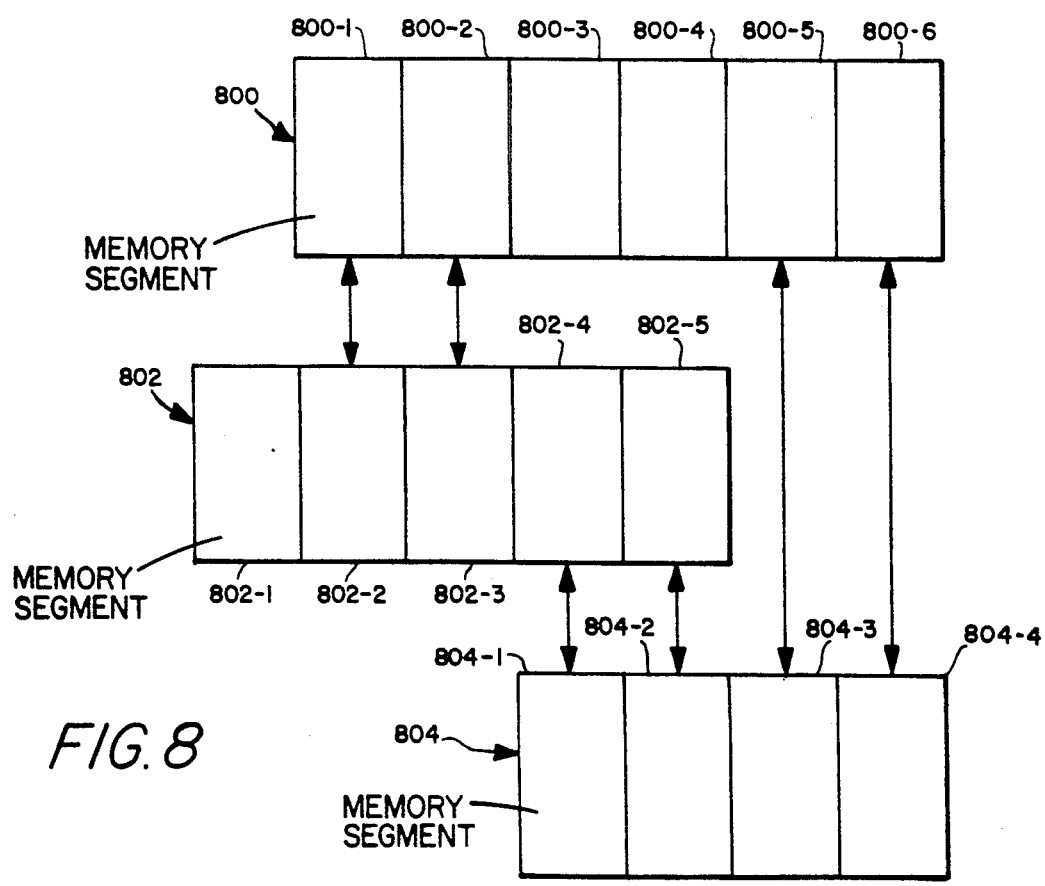
FIG. 8 illustrates additional memory transfer capabilities between three segmented memories in accordance with the present invention.

Further, in accordance with the present invention, memories associated with a plurality of processors can be fabricated to enable flash transfer between selected pairs of memory segments of those memories. For example, with reference to FIG. 8, three memories 800, 802 and 804 are respectively associated with three different processors of a multiprocessor system. Memory 800 is segmented into segments 800-1 through 800-6, memory 802 is segmented into segments 802-1 through 802-5 and memory 804 is segmented into segments 804-1 through 804-4. The bidirectional arrows in FIG. 8 indicate the memory segment pairs between which flash transfers can be conducted. It is seen that by fabricating memories to create the indicated memory segment pairs, each processor can effect flash transfer of selected segments of its associated memory with memory segments associated with the other two processors. Such an arrangement can have great utility in a system in which one processor is a main processor while the other two processors are attached processors performing specialized functions. Also, as illustrated in FIG. 8, it is noted that not all segments of memory need be fabricated for association with other memory segments.

While the present invention has been described hereinabove as comprising memory storage cells containing the respective memory cells of two memories, the invention is not so limited. The invention can be practiced with storage cells containing the memory cells of more than two memories, so that by including appropriate control logic, the flash transfer of data can be effected from the cells of one memory to the cells of one or more of the other memories integrated into the same storage cell.

Figure 9:
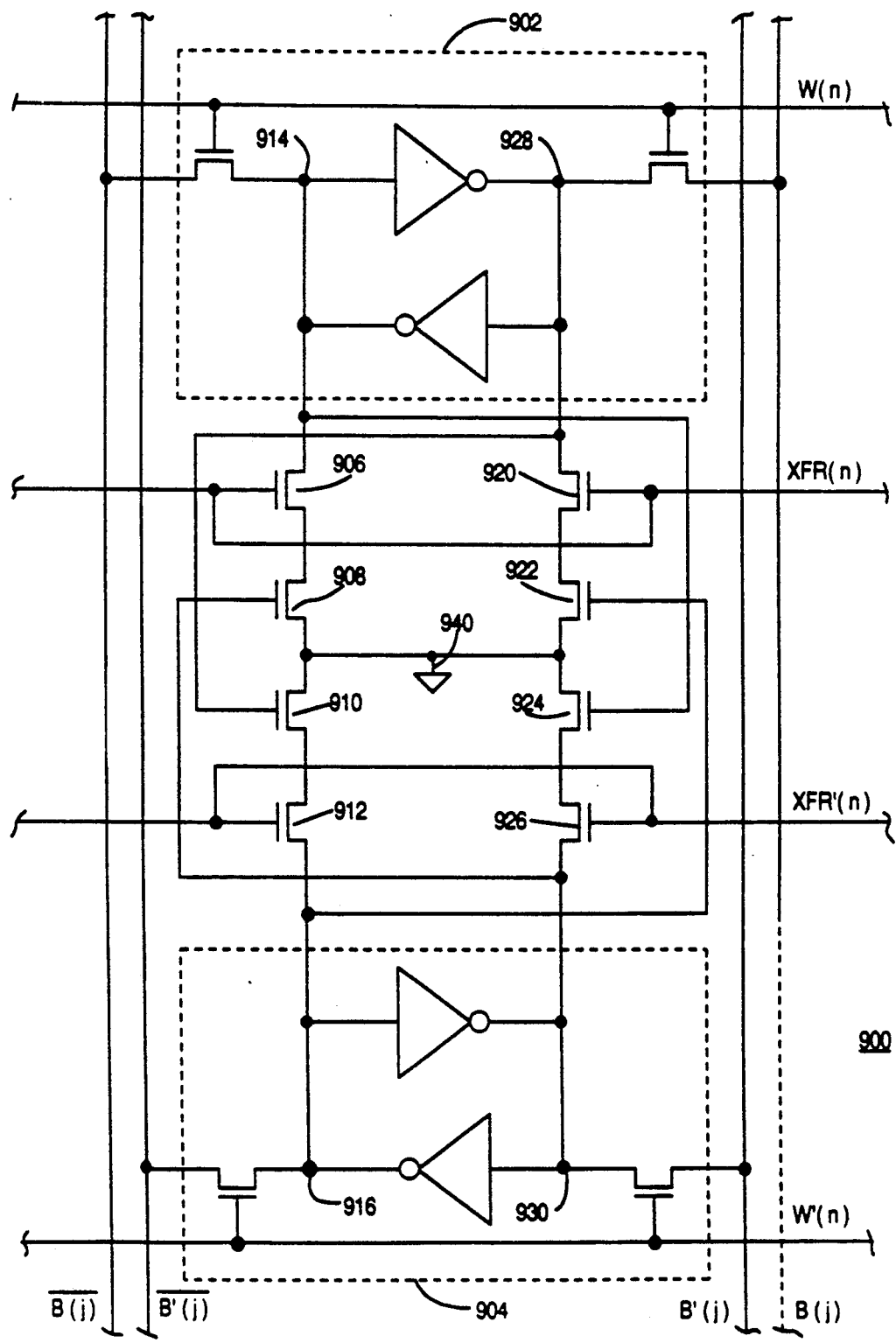
FIG. 9 illustrates a memory storage cell constructed in accordance with another embodiment of the present invention.

While the present invention has been described as including a storage cell constructed such that a flash transfer operation includes the step of reducing the supply voltage to the receiving memory cell, the invention is not so limited. Each storage cell may instead be constructed to enable flash transfer without the need for reducing the power supply to the receiving memory cell. A storage cell 900 so constructed and comprising two memory cells 902 and 904 is illustrated in FIG. 9. Each memory cell 902, 904 is constructed substantially the same as memory cells 302 and 304 illustrated in FIG. 3 and described hereinabove though the power supply to each inverter circuit is not shown in FIG. 9. The memory cells of storage cell 900 are coupled to receive bit and word signals in the same manner as described above with respect to memory cells 302 and 304.

Storage cell 900 includes a total of eight transfer transistors. Transfer transistors 906, 908, 910 and 912 are connected in series between nodes 914 and 916 of memory cells 902 and 904, respectively. Similarly, transfer transistors 920, 922, 924 and 926 are connected in series between nodes 928 and 930 of memory cells 902 and 904, respectively. Transfer transistors 906 and 920 are associated with memory cell 902 and have their respective gates connected to receive a transfer control signal XFR(n). Transfer transistors 912 and 926 are associated with memory cell 904 and have their respective gates connected to receive a transfer control signal SFR'(n). Further, the gate of transistor 910 is connected to receive the logic level voltage at node 928 of memory cell 902; the gate of transistor 908 is connected to receive the logic level voltage at node 930 of memory cell 904; the gate of transistor 922 is connected to receive the logic level voltage at node 916 of memory cell 904; and the gate of transistor 924 is connected to receive the logic level voltage at node 914 of memory cell 902. A path 940 to ground (or the negative voltage supply) is connected between the transfer transistors as shown in FIG. 9. As in the case of storage cell 300, the plurality of storage cells 900 comprising the two memories respectively corresponding to memory cells 902 and 904 are preferably disposed in a common integrated circuit substrate.

In operation, opposite logic level voltages will respectively be present at nodes 914 and 928 in accordance with the logic value stored by memory cell 902. Similarly, opposite logic level voltages will be present at nodes 916 and 930 of memory cell 904. As a result, a high logic level voltage will be present at one such node of each memory cell. This situation will in turn result in rendering conductive two transfer transistors, the respective gates of which are connected to the nodes at which the high logic level voltage is present. For example, if a high logic level voltage is present at nodes 914 and 930, then transistors 908 and 924 are rendered conductive. In order to effect the flash transfer of data within storage cell 900, a transfer control signal is applied to the transfer transistors associated with the receiving one of the memory cells, thereby rendering those transistors conductive. For example, if memory cell 904 is the receiving memory cell, then the transfer control signal XFR'(n) is applied and transistors 912 and 926 are rendered conductive. Continuing with this example, either transistor 910 or 924 must also be conductive at this time due to connection to a high logic level voltage in the sending memory cell (memory cell 902).

Thus, for example, if node 914 is at the high logic level voltage, then transistor 924 is conducting. Since transistor 926 is also conducting, due to application of the XFR'(n) signal, node 930 of memory cell 904 is connected to the source of low logic level voltage via transistors 924 and 926 and path 940. As a result, the inverter circuits of memory cell 904 will assume the same logic state as memory cell 902 corresponding to the digital data value stored in the latter memory cell. Thus, in accordance with the invention as constructed with storage cells such as storage cell 900, the flash transfer in one or the other direction between a sending and a receiving memory is effected by applying the transfer control signal to the transfer transistors associated with each memory cell of the receiving memory.

While the present invention has been described as effecting the transfer of data, unmodified, from the cells of one memory to the cells of one or more memories, the invention is not so limited. The circuitry interconnecting the respective memory cells of each storage cell, such as transfer logic 270 in FIG. 2, can include logic means, responsive to a logic operation signal included in the transfer control signal, for selectively performing a logic operation on the digital data being transferred, the nature of the logic operation being determined by the logic signal. For example, in the case of a two memory system, the only logic operation that can be performed is inversion of the bit being transferred, so that the inversion of the bit stored in the sending memory is written into the receiving memory. In the case of systems with more than two memories, there is no restriction on the types of combinational operations that can be performed, in each storage cell, with the bits stored in the memory cells of two or more memories, the logic operation result being stored in the respective memory cells of another one or more of the memories.

While the signals illustrated in the timing diagram in FIG. 4 have the illustrated logic levels when asserted, the invention may be constructed and practiced such that any one of the signals is asserted when at either a positive or negative logic level.

Furthermore, while a time delay circuit has been provided for driving various logic blocks in accordance with predetermined time delays, the invention is not so limited. The time delay circuit can be omitted and each logic block can instead be constructed to include circuitry that implements the time delay appropriate thereto.

Thus, it is intended that the present invention cover the modifications and the variations of this invention provided they come within the scope of the appended claims and their equivalents.

What is claimed is:

1. A digital processing system, comprising:
   first processor means for processing digital data in accordance with programmed instructions;
   second processor means for processing digital data in accordance with programmed instructions;
   a first random access memory (RAM) comprising a first plurality of memory cells for storing digital data;
   a second RAM comprising a second plurality of memory cells for storing digital data;
   input/output (I/O) means, responsive to external I/O signals, for providing access by said first processor means to the digital data stored in said first RAM and for providing access by said second processor means to the digital data stored in the second RAM; and
   control means, responsive to a plurality of transfer control signals, for copying selected segments of one of said first and second RAMs into segments of the other of said first and second RAMs, said control means including
   an enable register having a plurality of bit positions loaded by respective ones of said transfer control signals, with respective bit positions of said enable register corresponding to different ones of said segments and each bit having a first state to enable copying and a second, different state to inhibit copying of corresponding segments of said first and second RAMs.

2. A digital processing system, comprising:
   first processor means for processing digital data in accordance with programmed instructions;
   second processor means for processing digital data in accordance with programmed instructions;
   a first random access memory (RAM) comprising a first plurality of memory cells for storing digital data;
   a second RAM comprising a second plurality of memory cells for storing digital data;
   input/output (I/O) means, responsive to external I/O signals, for providing access by said first processor means to the digital data stored in said first RAM and for providing access by said second processor means to the digital data stored in the second RAM; and
   control means, responsive to a plurality of transfer control signals, for copying a selected portion of digital data stored in memory cells of one of said first and second RAMs into memory cells of the other of said first and second RAMs, said control means including
   an enable register having a plurality of bit positions loaded by respective ones of said transfer control signals, with respective bit positions of said enable register corresponding to different ones of said segments and each bit having a first state to enable copying and a second, different state to inhibit copying of corresponding segments of said first and second RAMs;
   a direction register having a plurality of bit positions loaded by respective ones of said transfer control signals, with respective bit positions of said direction register corresponding to different ones of said segments and each bit having a first state to direct copying from a corresponding segment of said first RAM to a corresponding segment in said second RAM and a second, different state to direct copying from that corresponding segment of said second RAM to that corresponding segment in said first RAM;
   wherein said I/O means further includes
   first read/write means for reading and writing data in said first RAM, and
   second read/write means, operating independently of said first read/write means, for reading and writing data in said second RAM.

3. The digital processing system of claim 2 wherein said first read/write means includes a first buffer and a first sense amplifier operatively coupled between said first RAM and an I/O multiplexer, said first buffer being coupled to a first write input terminal and said first sense amplifier being coupled to a first read output terminal; and wherein said second read/write means includes a second buffer and a second sense amplifier operatively coupled between said second RAM and said I/O multiplexer, said second buffer being coupled to a second write input terminal and said second sense amplifier being coupled to a second read output terminal.

* * * * *